(12) United States Patent  
Schürz et al.

(10) Patent No.: US 7,097,484 B2
(45) Date of Patent: Aug. 29, 2006

(54) SEALING ELEMENT FOR THE PIEZO ACTUATOR OF A FUEL INJECTION VALVE

(75) Inventors: Willibald Schürz, Pielenhofen (DE); Martin Simmet, Bad Abbach (DE); Marcus Unruh, Zeitlarn (DE)

(73) Assignee: Siemens Aktiengesellschaft, Munich (DE)

( * ) Notice: Subject to any disclaimer, the term of this patent is extended or adjusted under 35 U.S.C. 154(b) by 62 days.

(21) Appl. No.: 10/913,069

(22) Filed: Aug. 6, 2004

(65) Prior Publication Data

US 2005/0006495 A1     Jan. 13, 2005

Related U.S. Application Data

(63) Continuation of application No. PCT/DE03/00409, filed on Feb. 12, 2003.

(30) Foreign Application Priority Data

Feb. 13, 2002  (DE) ................ 102 05 909

(51) Int. Cl.
*H01R 13/52*    (2006.01)
(52) U.S. Cl. .................. 439/279; 439/587
(58) Field of Classification Search ........ 439/279, 439/587
See application file for complete search history.

(56) References Cited

U.S. PATENT DOCUMENTS 5,720,487 A * 2/1998 Kato ................ 277/637
5,797,761 A   8/1998 Ring ................ 439/320
6,036,541 A * 3/2000 Koumatsu ............ 439/587

FOREIGN PATENT DOCUMENTS

| DE | 298 07 815 U1 | 10/1998 |
| DE | 198 18 068 A1 | 10/1999 |
| DE | 198 44 742 C1 | 3/2000 |
| DE | 198 44 743 C1 | 6/2000 |
| DE | 200 18 787 U1 | 2/2001 |
| DE | 199 40 054 A1 | 3/2001 |
| DE | 100 45 706 A1 | 4/2001 |
| DE | 197 15 487 C2 | 6/2002 |
| DE | 199 58 704 C2 | 10/2002 |
| EP | 1 130 249 A2 | 9/2001 |
| JP | 2000-197374 | 7/2000 |

* cited by examiner

*Primary Examiner*—Truc Nguyen
(74) *Attorney, Agent, or Firm*—Baker Botts L.L.P.

(57) ABSTRACT

The sealing element consisting entirely of elastomer is plugged onto the head plate of a piezo actuator for a fuel injection valve. Encircling sealing bulges (6) are formed on the first end of the sealing element and effect a sealing toward the injector body (2). The sealing element has passages for accommodating contact pins (7), whereby sealing lips (8) are formed around the passages in order to seal the contact pins (7). The sealing actions of the sealing bulges (6) and of the sealing lips (8) are separate from one another.

20 Claims, 3 Drawing Sheets

SEALING ELEMENT FOR THE PIEZO ACTUATOR OF A FUEL INJECTION VALVE

CROSS REFERENCE TO RELATED APPLICATION

This application is a continuation of copending International Application No. PCT/DE03/00409 filed Feb. 12, 2003 which designates the United States, and claims priority to German application no. 102 05 909.8 filed Feb. 13, 2002.

TECHNICAL FIELD OF THE INVENTION

This invention relates to a sealing element that can be plugged onto the head plate of a piezo actuator for a fuel injection valve of an internal-combustion engine as well as a piezo actuator with such a sealing element.

DESCRIPTION OF THE RELATED ART

For the fuel supply of internal-combustion engines, high pressure storage injection systems are increasingly being used. Such injection systems are known as common rail systems (for diesel engines) and HPDI injection systems (for spark-ignition engines). For these injection systems, the fuel is fed with a high-pressure pump to a common pressure reservoir for all the cylinders of the engine and from which the injection valves supply the individual cylinders. The opening and closing of the injection valves can be controlled electromagnetically or electrically; in the present case, electrical piezo actuators are used for this purpose.

In such arrangements the piezo actuator usually acts on a control or servo valve that hydraulically controls the pressure that is exerted on the nozzle needle of the injection valve. Therefore, the piezo actuator does not directly activate the nozzle needle of the injection valve, but it is indirectly activated via the control or servo valve.

The German patent specification DE 198 44 742 C1 describes a connection for a piezo actuator used in a synthetic sleeve that electrically connects the piezo actuator to the connecting pins to which external leads can be connected. In this specification, the connecting pins are pressed into or molded integrally in the synthetic sleeve to form a positive lock and/or pass fit and an electrically conductive conductor track is connected to the connecting pins in each case, said conductor track leading from the connecting pin to one of the electrical connections of the piezo actuator. The pass-fit extrusion coat or positive lock of the connecting pins into the synthetic sleeve results in the synthetic sleeve acting as a fixed clamping device which completely absorbs the forces at the contact pins. The sensitive contact lugs located directly at the piezo connections exert no force.

The German patent specification DE 198 44 743 C1 describes a contact tongue carrier for sealing and positioning contact pins. The contact tongue carrier has holes for the contact pins to which weld-on clips are arranged in such a way that they can be welded to the contact pins. At the top edge of a hole, an eccentric sealing lip is arranged in such a way that the center point of the sealing lip diameter is shifted away from the center of the hole in the direction of the weld-on clip. This eccentric sealing lip on the one hand takes care of reliably sealing the contact pin and contact tongue carrier by means of an elastic surface at the contact pin. At the same time, the sealing lip, by means of its eccentric geometry, is shifted to the weld-on clip which ensures that the contact pin is positioned independently of the production tolerances and that the weld-on clip is pressed against it.

SUMMARY OF THE INVENTION

The object of the invention is to make available both a sealing of the piezo actuator from the injector body and a sealing of the contact pins that is very cost-effective.

The object can be achieved according to the invention by a sealing element that can be plugged onto the head plate of a piezo actuator for a fuel injection valve of an internal-combustion engine, in which case the piezo actuator is provided to be fitted in the injector body of an injection engine, wherein the sealing element consists of an elastomer, at least one encircling sealing bead is formed on the first end of the sealing element by means of which the sealing element can be inserted into the injector body and seals it off from the injector body, the sealing element has at least one breakthrough for accommodating contact pins which pass through the sealing element in a longitudinal direction, in which case the at least one breakthrough is sealed by means of a second sealing means to the contact pins, and the sealing effects of at least one encircling sealing bead, on the one hand, and the second sealing means, on the other hand, are decoupled from one another.

The object can also be achieved by a piezo actuator that contains both a piezo stack and a sealing element wherein the sealing element comprises at least one encircling sealing bead formed on the first end of the sealing element by means of which the sealing element can be inserted into an injector body and seals it off from the injector body, at least one breakthrough for accommodating contact pins which pass through the sealing element in a longitudinal direction, and sealing means for sealing the at least one breakthrough to the contact pins, wherein the sealing element consists of an elastomer, and wherein the at least one encircling sealing bead and the sealing means are decoupled from one another.

The sealing element according to the invention can be plugged onto the head plate of a piezo actuator for a fuel injection valve of an internal-combustion engine, in which case the piezo actuator is provided to be fitted in the injector body of an injection engine. The sealing element consists of an elastomer. At least one bead is formed all around the first end of the sealing element with which the sealing element can be introduced into the injector body, which forms a seal to the injector body. The sealing element has at least one breakthrough for accommodating contact pins which pass through the sealing element in a longitudinal direction. The at least one breakthrough is sealed by a second sealing means from the contact pins, in which case the sealing actions of the at least one sealing bead, on the one hand, and the second sealing means, on the other hand, are decoupled from one another.

According to the invention, the sealing element for the piezo actuator of an injection valve makes it possible to seal different sealing points with just one single part made of an elastomer material. In this way, by means of the sealing bead around the sealing element it is possible to seal the hole around the sealing element in the injector housing into which the piezo actuator is inserted. By means of this seal, the inner part of the injector housing, therefore the area where the actuators are installed, can be insulated hermetically from the outside area.

The electrical connections for the piezo actuator pass through the sealing element in the form of contact pins. For this, according to the invention, the elastomer part has at least one breakthrough into which the contact pins can be inserted. As a result, the various electrical connections are insulated from one another. In addition, the correct positioning of the connections is guaranteed which is very important for automated production.

In order to seal the connection created by the breakthroughs between the inside area and the outside area of the actuator of the injector housing from a wide diversity of liquids, contamination, etc., at least one of the breakthroughs to the contact pins is sealed using two sealing means.

The different seals made by the component operate entirely separately from one another and do not adversely affect one another. A deformation in the area of the sealing beads does not affect the seal made by the second sealing means and vice versa. Therefore, the two sealing functions are separate from one another so that any deformations which occur do not adversely affect the seal.

According to the invention, the elastomer part is easy and inexpensive to make, is easy to fit and covers all the required functions. The best possible use is made of the available installation area.

It is an advantage if the second sealing means are sealing lips which in each case are formed around at least one breakthrough on the first end of the sealing element.

According to the invention, this embodiment of the invention provides flexible sealing lips on the side of the elastomer part facing the outside area and which. encircle the contact pins like a sleeve. In this way, it is possible to reliably seal the connection created by the breakthroughs between the inside area and the outside area of the actuator of the injector housing from a very wide diversity of liquids, contaminants, etc. As a result, the sealing effects of at least one sealing bead, on the one hand, and the sealing lips formed on the first end of the sealing element, on the other hand, are completely decoupled from one another: In the case of a deformation in the area of the encircling sealing beads, the flexible sealing lips reliably seal the breakthroughs for the contact pins as has been described above. On the other hand, if positive forces act on the contact pins, then the sealing lips compensate for the shifting of the contact pins without this having an adverse effect on the seal made by at least one sealing bead.

According to an advantageous embodiment of the invention, an elastomer grommet is formed on the end of the sealing element opposite the first end, in which case the sealing element can be plugged onto the head plate of a piezo actuator by means of the elastomer grommet. When the piezo actuator is installed in the recess of the injector housing provided for this, the elastomer grommet encircles the head plate of the piezo actuator and therefore the piezo actuator can be supported in such a way that the vibrations are dampened and absorbed. In particular the sensitive leads of the piezo actuator are protected in this way.

It is advantageous if the elastomer grommet is formed in such a way that when it is plugged onto the head plate of the piezo actuator, it completely seals the piezo actuator on the outside. By means of the formed elastomer grommet, the sealing element according to the invention can also perform a third sealing function and protect the piezo actuator from humidity, dirt, etc.

Thus, it is also advantageous if the inside of the elastomer grommet is embodied as a counterpart to a spigot formed on the head plate of the piezo actuator. When mounting, the sealing element with the formed elastomer grommet is plugged onto the spigot formed on the head plate. Because the grommet is embodied as a counterpart to this head plate, improved mechanical fixing of the piezo actuator can be achieved.

At the same time, it is advantageous if the elastomer grommet serves as a positioning means when positioning the piezo actuator as well as the contact pins during the insertion process. When the piezo actuator is fitted, the contact pins are first of all pushed through the breakthroughs of the sealing element and in each case connected electrically to one of the leads. The piezo actuator is subsequently pushed with its head plate first into the sealing element; at the same time the contact pins are pulled out from the sealing element and can then be shortened accordingly. As a result, the piezo actuator with the attached sealing element can be mounted in the recess of the injector housing provided for this. In this way, the sealing element with the formed elastomer grommet serves as a positioning means when the piezo actuator is installed.

It is advantageous if the outside of the elastomer grommet is embodied as a counterpart to the recess in the injector body provided to install the piezo actuator and after it has been mounted in the injector body it fits tightly into the recess. In this way, a stable mechanical fit of the piezo actuator in the injector body can be guaranteed. In addition, it is ensured that the piezo actuator is correctly positioned relative to the injector body.

According to an advantageous embodiment of the invention, the at least one encircling sealing bead, on the one hand, and the second sealing means, on the other hand, are arranged at different levels transverse to the longitudinal direction to decouple the sealing effects. Because the sealing areas are on different levels, deformations in the vicinity of a sealing-area do not affect other sealing areas. A deformation of the sealing element in the area of the sealing beads, for example, does not affect the seal of the contact pins implemented by means of the sealing lips. On the other hand, a deformation brought about by a positive force in the area of the sealing lips for the contact pins guarantees that the seal between the piezo actuator and the recess of the injector body is not adversely affected.

According to an additional advantageous embodiment of the invention, to decoupled the sealing effects, the at least one encircling sealing bead is arranged at a radial distance to the second sealing means. In addition, such a radial distance can also prevent deformations in the vicinity of a sealing area from affecting other sealing areas and possibly causing these to start leaking. Compared to the above-mentioned embodiment of the invention in the case of which the sealing areas are arranged at different levels, the sealing element can be made relatively flat for this embodiment.

The piezo actuator according to the invention includes a piezo stack as well as a sealing element of the type described above. Thus, it is advantageous if the leads of the piezo stack are connected electrically to the contact pins that pass through the breakthroughs of the sealing element. The contact pins are fixed mechanically by means of the sealing element. In this way, a degree of strain relief is created for the leads of the piezo stack. As a result, forces acting from the outside on the contact pins can be prevented from damaging the leads of the piezo stack.

BRIEF DESCRIPTION OF THE DRAWINGS

An embodiment of the invention is explained in greater detail below with reference to the drawing. The figures show.

DETAILED DESCRIPTION OF THE PREFERRED EMBODIMENTS

Figure 1:
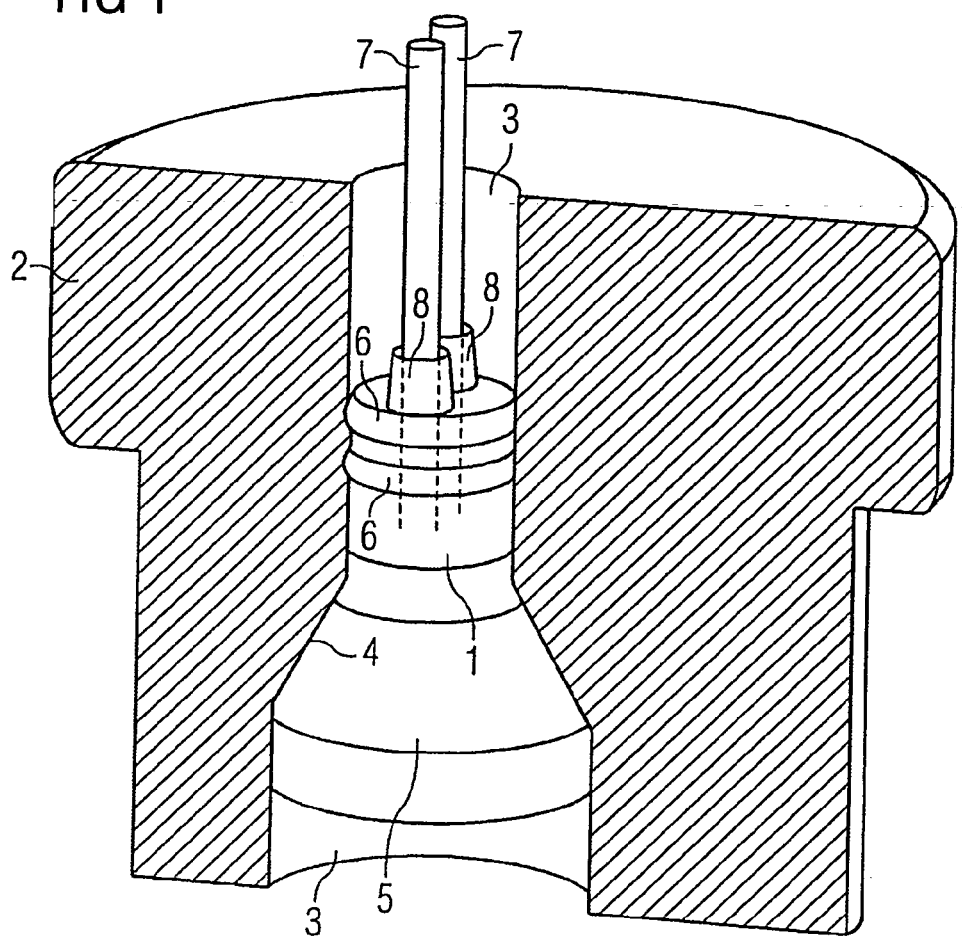
FIG. 1 the mounting position of the sealing element according to the invention.

FIG. 1 shows how the inventive sealing element 1 is inserted into a specially provided recess 3 of the injector body 2. The recess 3 has a section 4 at the bottom end that tapers conically towards the engine. An elastomer grommet 5 is formed on the sealing element 1, said elastomer grommet embodied as a counterpart to section 4. By means of the elastomer grommet 5, the sealing element 1 can be plugged onto the head plate of the piezo actuator. The sealing element 1 is inserted from the bottom so deep into the recess 3 that the elastomer grommet 5 forms a tight fit against the section 4 of the recess 3.

The sealing element 1 is completely made of elastomer. At the top end of the sealing element 1, two encircling sealing beads 6 are formed that are compressed when they are inserted into the sealing element in the recess 3 and therefore seal the recess 3 from the outside. As a result, the inside part of the injector body 2 is sealed hermetically from the environment. In this way, the mounting area for the piezo actuator is protected against environmental influences and particularly against a very wide diversity of liquids and this guarantees a reliable functioning of the piezo drive for the entire service life of the vehicle.

The sealing element 1 has two breakthroughs running in a longitudinal direction. These breakthroughs serve to accommodate the contact pins 7 that are connected to the electrical leads of the piezo actuator. A control voltage is applied to the piezo actuator via the contact pins 7. At the top end of the sealing element 1, flexible sealing lips 8 are formed around each breakthrough that completely seal the pushed-in contact pins 7. In this way, it is ensured that there can be no ingress of liquid from the outside into the piezo actuator.

In the case of the sealing element 1 according to the invention, the sealing function brought about by the encircling sealing beads 6 is completely separate from the sealing function brought about by the flexible sealing lips 8. As a result, a deformation in the area of the encircling sealing beads 6 that occurs because of the compression, does not affect the sealing efficiency of the flexible sealing lips 8. On the other hand, a forced position of the contact pins 7 can be compensated for by the flexibility of the sealing lips 8 without this adversely affecting the efficiency of the sealing beads 6. The elastomer material can compensate and dampen relative movements that result because of thermal expansions and vibrations.

In order to ensure that the sealing functions are separate from one another and do not adversely affect one another, there must be sufficient elastomer material between the different seals to serve as a buffer function. Therefore, in the embodiment shown, the different sealing functions implemented by the sealing element 1 are decupled from one another in such a way that the sealing beads 6 and the sealing lips 8 are arranged at different levels transverse to the longitudinal direction of the sealing element 1.

Figure 2:
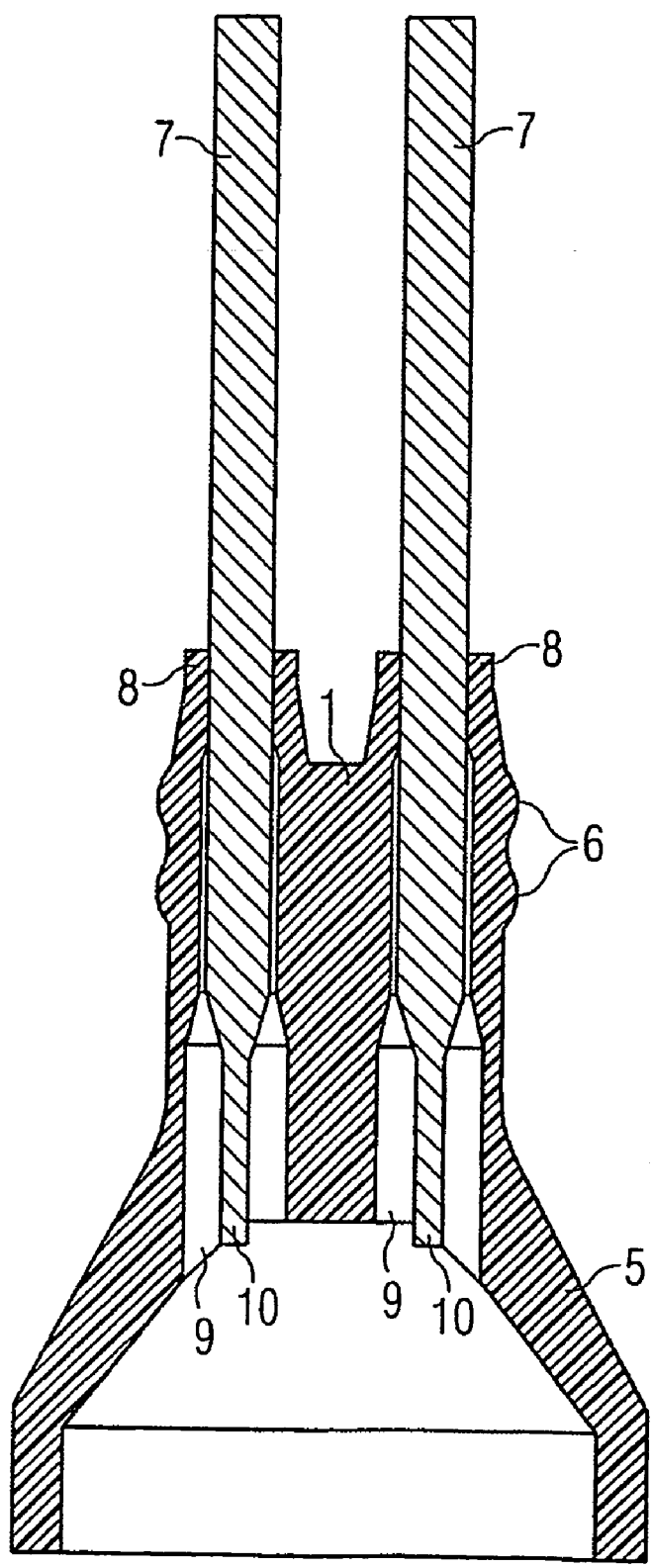
FIG. 2 a longitudinal section through the sealing element according to the invention.

FIG. 2 shows a cross-section through the sealing element 1 on the basis of which the different sealing effects implemented by means of the sealing element 1 can be identified. The encircling elastomer beads 6 seal the sealing element 1 from the associated recess of the injector body. The breakthroughs 9 that pass in a longitudinal direction through the sealing element 1 serve to accommodate the two contact pins 7. The sealing lips 8 seal the contact pins 7 from the piezo actuator. The leads of the piezo actuator can be welded to the flat parts 10 or be connected electrically in another way. The elastomer grommet 5 is formed on the bottom end of sealing element 1 by means of which the sealing element 1 consisting of the said elastomer grommet is plugged onto the head plate of the piezo actuator.

Figure 3:
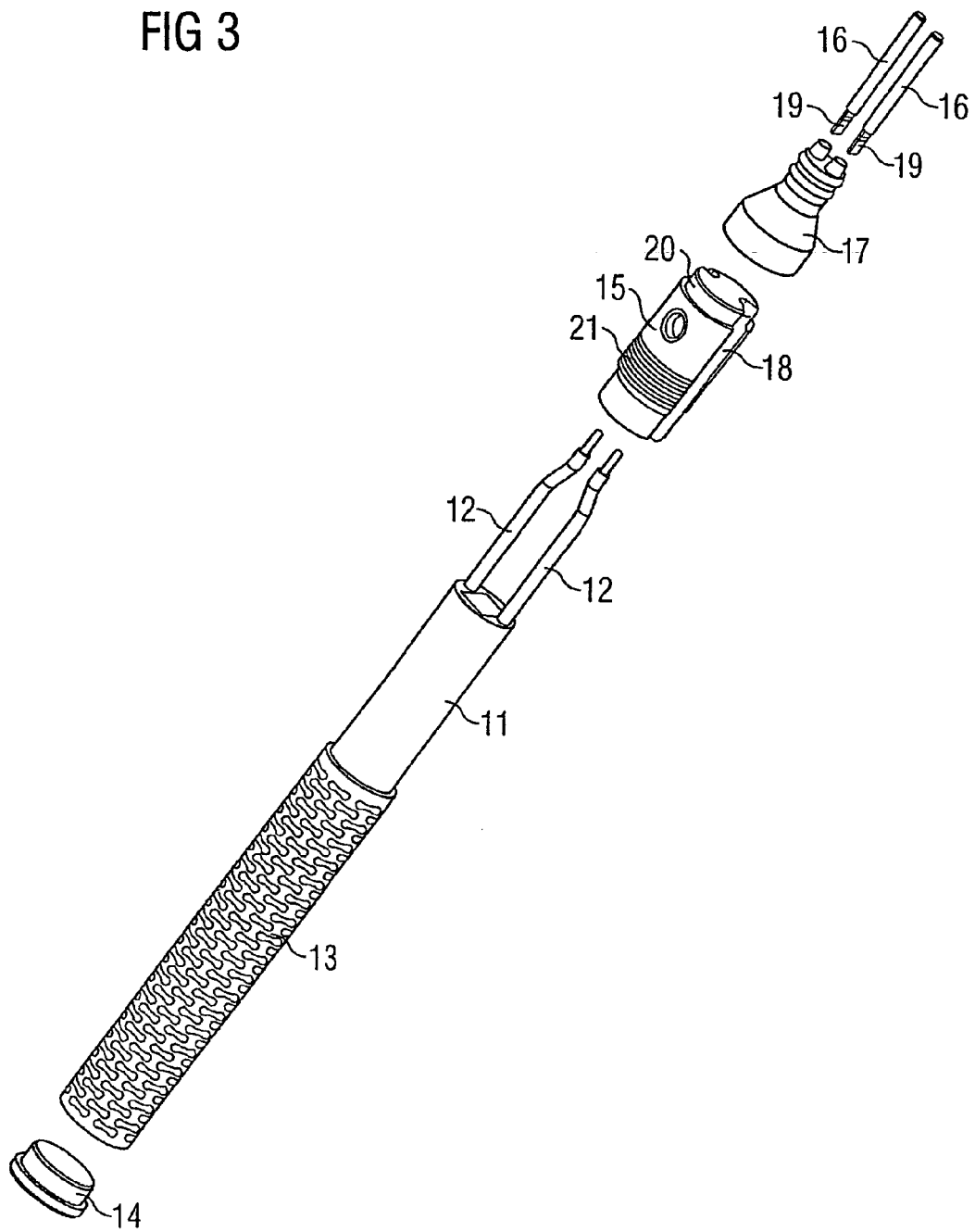
FIG. 3 an overview of a piezo actuator in the case of which the sealing element according to the invention is used.

FIG. 3 is a view of the overall structure of the piezo actuator. The piezo stack 11 can be deformed in a longitudinal direction by applying a voltage signal to the leads 12. The piezo stack 11 is located inside the Bourdon tube 13 that is welded to the base plate 14. The Bourdon tube 13 is connected to the head plate 15 in such a way that it is under a certain initial stress that acts as a resetting force for the piezo stack 11.

In order to fit the piezo actuator, the contact pins 16 pass through the breakthroughs of the sealing element 17 and through the side slots 18 of the head plate 15. The flat parts 19 are connected to the leads 12 in an electrically conductive way, for example, by welding. In this case, particularly laser beam, arc or resistance welding processes are considered. Subsequently, the sealing element 17 is also moved towards the head plate 15; as a result, the contact pins 16 are pulled out of the sealing element 17. The sealing element 17 is put onto the formed spigot 20. This aligns the piezo stack 11, the head plate 15 and the sealing element 17 relative to one another. The contact pins 16 can now be shortened to the desired length.

Subsequently, the assembled piezo actuator is inserted into the corresponding recess in the injector body and fixed in the desired position. This can, for example, be done by the piezo actuator being sealed off from the injector body by means of calking elements. In this case the thread 21 is used for fixing the calking elements.

We claim:

1. An elastomer sealing element that can be plugged onto the head plate of a piezo actuator for a fuel injection valve of an internal-combustion engine, in which case the piezo actuator is provided to be fitted in the injector body of an injection engine, the sealing element comprising:

at least one encircling sealing bead formed on a middle portion of the sealing element by means of which the sealing element is inserted into the injector body;

at least one breakthrough for accommodating a contact pin which passes through the sealing element in a longitudinal direction, wherein the breakthrough is sealed by a sealing lip, wherein the sealing lip is formed on a distal end of the sealing element; and a grommet portion forming a proximal end of the sealing element opposite the distal end, wherein the sealing element can be plugged into the head plate of a piezo actuator by means of the grommet portion, wherein the grommet portion is radially larger than the encircling sealing bead and the sealing lip.

2. The sealing element according to claim 1, wherein the sealing lip is formed around the at least one breakthrough on the first end of the sealing element.

3. The sealing element according to claim 1, wherein the grommet portion is formed in such a way that when it is plugged onto the head plate of the piezo actuator, it completely seals the piezo actuator on the outside.

4. The sealing element according to claim 1, wherein the inside of the grommet portion is embodied as a counterpart to a spigot formed on the head plate.

5. The sealing element according to claim 1, wherein the grommet portion at the same time serves as a positioning means when positioning the piezo actuator as well as the contact pins during the joining process.

6. The sealing element according to claim 1, wherein the outside of the elastomer grommet is embodied as a counterpart to the recess in the injector body provided to mount the piezo actuator and after it has been mounted in the injector body it fits tightly into the recess.

7. The sealing element according to claim 1, wherein at least one encircling sealing bead and the sealing lip are arranged at different levels transverse to the longitudinal direction to separate the sealing efficiencies.

8. The sealing element according to claim 1, wherein at least one encircling sealing bead for separating the sealing efficiency is arranged at a radial distance to the sealing lip.

9. A piezo actuator comprising:
   a piezo stack; and
   a sealing element comprising:
      at least one encircling sealing bead formed on a middle portion of the sealing element by means of which the sealing element is inserted into the injector body;
      at least one breakthrough for accommodating a contact pin which passes through the sealing element in a longitudinal direction, wherein the breakthrough is sealed by a sealing lip, wherein the sealing lip is formed on a distal end of the sealing element; and
      a grommet portion forming a proximal end of the sealing element opposite the distal end, wherein the sealing element can be plugged into the head plate of a piezo actuator by means of the grommet portion portion, wherein the grommet portion is radially larger than the encircling sealing bead and the sealing lip.

10. The piezo actuator according to claim 9, wherein the leads of the piezo stack are connected to the contact pins in an electrically conductive way that pass through at least one breakthrough of the sealing element.

11. The piezo actuator according to claim 9, wherein the sealing lip is formed around the at least one breakthrough on the first end of the sealing element.

12. The piezo actuator according to claim 9, wherein the grommet portion is formed in such a way that when it is plugged onto the head plate of the piezo actuator, it completely seals the piezo actuator on the outside.

13. The piezo actuator according to claim 9, wherein the inside of the grommet portion is embodied as a counterpart to a spigot formed on the head plate.

14. The piezo actuator according to claim 9, wherein the grommet portion at the same time serves as a positioning means when positioning the piezo actuator as well as the contact pins during the joining process.

15. The piezo actuator according to claim 9, wherein the outside of the grommet portion is embodied as a counterpart to a recess in the injector body provided to mount the piezo actuator and after it has been mounted in the injector body it fits tightly into the recess.

16. The piezo actuator according to claim 9, wherein at least one encircling sealing bead and the sealing lip are arranged at different levels transverse to the longitudinal direction to separate the sealing efficiencies.

17. The piezo actuator according to claim 9, wherein at least one encircling sealing bead for separating the sealing efficiency is arranged at a radial distance to the sealing lip.

18. An elastomer sealing element that can be plugged onto the head plate of a piezo actuator for a fuel injection valve of an internal-combustion engine, in which case the piezo actuator is provided to be fitted in the injector body of an injection engine, the sealing element comprising:
   at least one encircling sealing bead formed on a sealing portion of the sealing element by means of which the sealing element is inserted into the injector body;
   at least one breakthrough for accommodating a contact pin which passes through the sealing element in a longitudinal direction, wherein the breakthrough is sealed by a sealing lip, wherein the breakthrough and sealing lip are formed on the sealing portion of the sealing element, wherein at least one encircling sealing bead and the sealing lip are arranged at different levels transverse to the longitudinal direction to separate the sealing efficiencies; and
   a grommet portion of the sealing element opposite the sealing portion, wherein the sealing element can be plugged into the head plate of a piezo actuator by means of the grommet portion, wherein the grommet portion is radially larger than the encircling sealing bead and the sealing lip.

19. The elastomer sealing element according to claim 18, wherein the inside of the grommet portion is embodied as a counterpart to a spigot formed on the head plate.

20. The elastomer sealing element according to claim 18, wherein the grommet portion at the same time serves as a positioning means when positioning the piezo actuator as well as the contact pins during the joining process.

* * * * *